United States Patent [19]

Ashida et al.

[11] Patent Number: 4,862,241

[45] Date of Patent: Aug. 29, 1989

[54] SEMICONDUCTOR INTEGRATED CIRCUIT DEVICE

[75] Inventors: Yasuhiro Ashida; Shigeki Yokota, both of Gifu, Japan

[73] Assignee: Sanyo Electric Co. Ltd., Osaka, Japan

[21] Appl. No.: 807,831

[22] Filed: Dec. 11, 1985

[30] Foreign Application Priority Data

Dec. 18, 1984 [JP] Japan ................................ 59-266712

[51] Int. Cl.⁴ .......................................... H01L 27/10
[52] U.S. Cl. ...................................... 357/45; 357/42; 357/51
[58] Field of Search ............................. 357/51, 42, 45

[56] References Cited

U.S. PATENT DOCUMENTS 4,516,312  5/1985  Tomita .................................. 357/42
4,549,131 10/1985  Kusazaki .............................. 357/45

FOREIGN PATENT DOCUMENTS 58-44592 10/1983 Japan .
59-958    1/1984 Japan ..................................... 357/45

Primary Examiner—William D. Larkins
Attorney, Agent, or Firm—Darby & Darby

[57] ABSTRACT

The inventive semiconductor integrated circuit device comprises a plurality of regularly disposed elementary units, each including a P channel MOS FET element paired with and an N channel MOS FET element. Desired ones of the elementary units each comprise a MOS field effect transistor having an ordinary form of a source-drain region formed by a diffusion region, while the remaining elementary units each have a diffusion region selectively connected to serve as a resistive element. Consequently, a desired circuit can be implemented without a resistive element being formed on each elementary unit.

2 Claims, 2 Drawing Sheets

SEMICONDUCTOR INTEGRATED CIRCUIT DEVICE

BACKGROUND OF THE INVENTION

1. Field of the Invention

The present invention relates to a semiconductor integrated circuit device of the type manufactured by a master slice method. More specifically, the present invention relates to an MOS type large scale integration of a gate array.

2. Description of the Prior Art

An example of a semiconductor integrated circuit device of a master slice method is disclosed in, for example, Japanese Utility Model Publication Gazette No. 44592/1983, wherein an aggregation of elementary units each normally including an elementary circuit including a plurality of transistors and resistors is first formed in on a mass production basis in a single semiconductor piece or chip, and a connection mask is later fabricated depending on a line of products to be developed, so that any necessary transistors and resistors may be interconnected to provide a large scale integration having a desired electrical circuitry operation.

Since an aggregation of elementary units including transistors and resistors is formed a head of time on a mass production basis, it is sufficient to fabricate only a mask for a connection whenever a desire arises that a new line of products be developed, thereby to shorten a period of development. Furthermore, since an aggregation of elementary units can be commonly used to a variety of large scale integrations, a development cost is reduced.

It has been a general practice that such large scale integration of a master slice method is formed in a regular matrix type arrangement in a desired region of a semiconductor chip of an aggregation of elementary units including transistors and resistors and such standardization makes it possible to effectively employ an automatic arrangement and connection processing through a computer aided design by the use of a computer.

However, it is seldom that a resistive element becomes necessary at every elementary unit in such semiconductor integrated circuit, inasmuch as such resistive elements become necessary only in a particular case of such as an RC delay circuit, a circuit for suppressing a DC current, and so on. Accordingly, provision of a resistive element in every elementary unit leads to an increase in unnecessary area and results in a large size of a whole chip or reduction of the number of transistors contained in the same chip area, with the resultant limits to enhancement of the degree of integration.

SUMMARY OF THE INVENTION

Accordingly, an object of the present invention is to a semiconductor integrated circuit device of a master slice type, wherein a circuit requiring resistive elements such as a RC delay circuit, a circuit for decreasing a DC current and so on is realized without an increase in a chip area and without decreasing the number of transistors that can be contained therein.

One aspect of the present invention comprises a semiconductor integrated circuit device of a master slice type including an arrangement of a plurality of elementary units, wherein field effect transistors are formed with the source-drain regions thereof formed by a diffusion region of desired elementary units, while resistive elements are formed by selectively connecting arbitrary diffusion regions of the diffusion regions of the other elementary units.

Another aspect of the present invention comprises a semiconductor integrated circuit device of a master slice type, wherein field effect transistors are formed with the gate electrodes formed by an electrode of desired elementary units, while resistive elements are formed by selectively connecting arbitrary electrodes of the electrodes of the other elementary units.

In accordance with the present invention, it is possible to utilize the source-drain regions or the gate electrodes as resistive elements in a circuit portion where resistive elements are required, without necessity of fabricating a resistive element at an earlier time at every elementary unit. Accordingly, the present invention enables reduction in chip area and an increase of the number of transistors in case a given chip area in a semiconductor integrated circuit device of a master slice method.

These objects and other objects, features, aspects and advantages of the present invention will become more apparent from the following detailed description of the present invention when taken in conjunction with the accompanying drawings.

DESCRIPTION OF THE PREFERRED EMBODIMENTS

In the following description of the embodiments, a complementary metal-oxide inverter circuit employing a combination of P channel MOS transistors and N channel MOS transistors will be described as an example. However, it is pointed out that the present invention can be applied also to other types of integrated circuits, such as an integrated circuit employing bipolar technology of such as TTL's, ECL's and the like.

Figure 1:
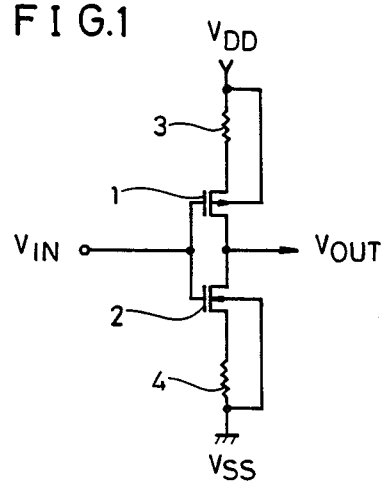
FIG. 1 is a schematic diagram of an inverter taken by way of an example of a circuit in which the present invention can be employed.

FIG. 1 is a schematic diagram of a complementary inverter comprising a P channel MOS field effect transistor 1 and N channel MOS field effect transistor 2. The inverter shown in FIG. 1 further comprises resistors 3 and 4 inserted between a voltage source $V_{DD}$ and the source of the P channel MOS field effect transistor 1 and between the source of the N channel MOS field effect transistor 2 and the ground $V_{SS}$, respectively, so that the voltages between the gates and sources of the respective field effect transistors 1 and 2 may be dropped and voltage references may be caused between the ground and the sources, thereby to increase the threshold values of the respective field effect transistors 1 and 2 thorough a backgate effect, thereby to suppress a current flowing through the inverter.

Figure 2:
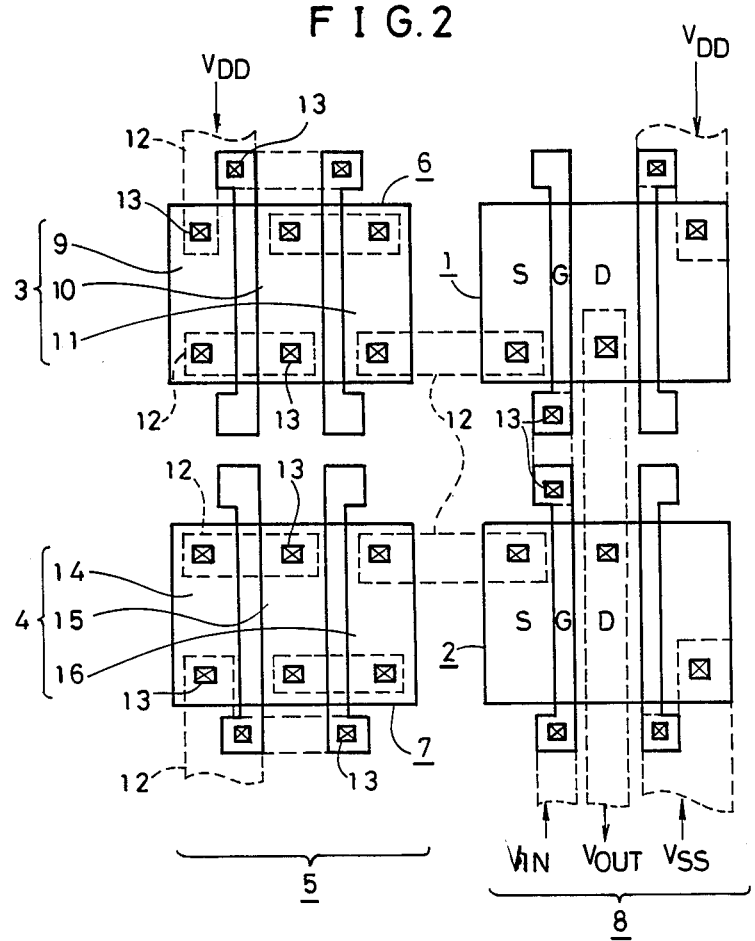
FIG. 2 is a view showing a pattern of a major portion of first embodiment of the present invention implementing the inverter shown in FIG. 1.

FIG. 2 shows a view of the first embodiment of the inventive gate array implementing the above described inverter. FIG. 2 shows a pattern diagram of the embodiment shown in FIG. 2 comprising the resistors 3 and 4 shown in FIG. 1 implemented with the respective source/drain regions of a P channel MOS field effect transistor 6 and an N channel MOS field effect transistor 7 of an elementary unit 5 and the respective MOS field effect transistors 1 and 2 shown in FIG. 1 implemented with an elementary unit 8 formed adjacent thereto.

Referring to FIG. 2, the reference numerals 9, 10 and 11 denote three P type diffusion regions inherently constituting a source region or a drain region of the P channel MOS field effect transistor 6, one of which is to be paired with another one. The pared diffusion of regions are connected in series with a metallic connection 12 of aluminum or the like (shown by a dotted line) and contacts 13 (shown) by a symbol of a letter x in a square to from the resistor 3. On the other hand, the reference numerals 14, 15 and 16 denote three N type diffusion regions inherently constituting a source region or a drain region of the N channel MOS field effect transistor one of which is 7 to be paired with another one, wherein these are connected in series with a metallic connection 12 of aluminum shown by dotted lines and a contact 13 (shown by a symbol of a letter X in a square) to form the resistor 4.

More specifically, one end of the above described resistor 3 in the elementary unit 5 is connected to the voltage source $V_{DD}$ and the other end of the resistor 3 is connected to the source region S of the P channel MOS field effect transistor 1 in the elementary unit 8, while the drain region D of the field effect transistor 1 is connected to the drain region D of the N channel MOS field effect transistor 2 and, furthermore, the source region S of the field effect transistor 2 is connected to one end of the above described resistor 4 in the elementary unit 5, while the other end of the resistor 4 is connected to the ground $V_{SS}$. The input signal line $V_{IN}$ in the elementary unit 8 is connected to the gate electrodes G and G of both field effect transistor 1 and 2 and the output signal line $V_{OUT}$ is connected to the drain region D of one field effect transistor 1 and the drain region D of the other field effect transistor 2.

The respective gate electrodes of the elementary unit 5 constituting the resistors 3 and 4 are connected such that the gate electrode of the P channel field effect transistor 6 is connected to the voltage source $V_{DD}$ and the gate electrode of the N channel field effect transistor 7 is connected to the ground $V_{SS}$, respectively, thereby to render the respective field effect transistors 6 and 7 in an off state and to separate the respective regions 9, 10 and 11 and the regions 14, 15 and 16.

Examples of the resistance values of an actual circuit in the above described configuration will be shown in the following. The respective P type diffusion regions 9, 10 and 11 of the P channel MOS field effect transistor 6 are formed through diffusion of boron at $8 \times 10^{19}/cm^3$, wherein the resistance value in case where the sizes of the respective regions 9, 10 and 11 are $37\mu m \times 7\mu m$ are $600\Omega$ and the resistance value of the resistor 3 in case of series connection is $1800\Omega$. On the other hand, the respective N type diffusion regions 14, 15 and 16 of the N channel MOS field effect transistor 7 are formed through diffusion of phosphorus at $1 \times 10^{20} cm^3$ and the resistance values in case of the same sizes of the above described regions 9, 10 and 11 as above are $200\Omega$ and resistance value of the resistor 4 in such series connection is $600\Omega$.

Figure 3:
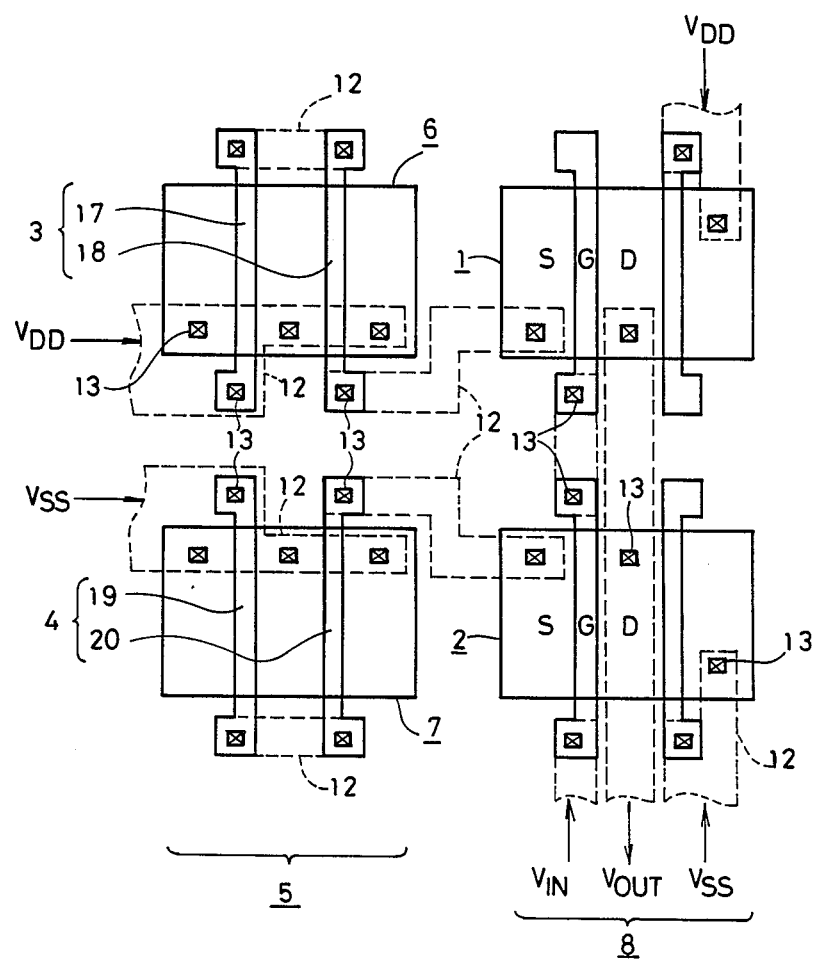
FIG. 3 is a view showing a pattern of a major portion of second embodiment implementing the inverter shown in FIG. 1.

FIG. 3 shows the second embodiment of the inventive gate array implementing the inverter shown in FIG. 1. FIG. 3 shows a pattern diagram of the second embodiment comprising the resistors 3 and 4 shown in FIG. 1 implemented with the gate electrodes of the P channel MOS field effect transistor 6 and the N channel MOS field effect transistor 7 of the elementary unit 5 and the respective field effect transistors 1 and 2 formed with the elementary unit 8 in the same manner as that of the above described embodiment shown in FIG. 1. Referring to FIG. 3, the reference numerals 17 and 18 denote polysilicon layers inherently constituting the gate electrode of the P channel MOS field effect transistor 6 to be layered with another one, wherein these are series connected with a metallic connection 12 of aluminum shown with the dotted line and a contact 13 shown by a symbol of a letter x in a square, thereby to form the resistor 3. On the other hand, the reference numerals 19 and 20 likewise denote polysilicon layers of the gate electrode of the N channel MOS field effect transistor 7, wherein these are series connected to form the resistor 4.

More specifically, in the second embodiment in discussion, the polysilicon layers 17 and 18 and 19 and 20 of the gate electrodes are employed in place of the diffusion regions 9, 10 and 11 and 14, 15 and 16 in case of the first embodiment shown in FIG. 2, wherein the resistance values of the respective polysilicon layers 17 to 20 are $500\Omega$ when the same is formed through doping of phosphorus at $1 \times 10^{20}/cm^3$ and the sizes thereof are $3\mu m \times 40\mu m$, so that the respective resistors 3 and 4 exhibit the resistance value of $1000\Omega$.

Meanwhile, the respective diffusion regions of the elementary unit 5 forming the resistors 3 and 4 are connected such that the P type diffusion region is connected to the voltage source $V_{DD}$ and the N type diffusion region is connected to the ground $V_{SS}$, thereby to keep them in the same potential.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device of the type manufactured by a master slice method, said device including an arrangement of a plurality of elementary units, each unit having separate diffusion regions defining a source region and a drain region respectively and a gate electrode overlying a region between the source and drain regions, said device comprising:

field effect transistor elements each having a source and a drain region and a gate electrode formed from the corresponding components of desired ones of said elementary units, and resistive elements formed by selectively connected source and drain diffusion regions in elementary units other than said desired elementary units, said selectively connected regions being connected in electrical circuit by conductors, the gate electrodes of units forming said resistive elements being connected to a voltage potential calculated to eliminate transistor action between the source and drain regions thereof, whereby the source and drain regions of said resistive elements provide the resistance thereof.

2. A semiconductor integrated circuit device in accordance with claim 1, wherein each said elementary unit comprises a P channel MOS field effect transistor element paired with an N channel MOS field effect transistor element.

* * * * *